(12) United States Patent
Park et al.

(10) Patent No.: US 7,595,542 B2
(45) Date of Patent: Sep. 29, 2009

(54) PERIPHERY DESIGN FOR CHARGE BALANCE POWER DEVICES

(75) Inventors: Chanho Park, Sandy, UT (US); Joseph A. Yedinak, Mountain Top, PA (US); Christopher Boguslaw Kocon, Mountain Top, PA (US); Jason Higgs, Mountain Top, PA (US); Jaegil Lee, Kyounggi-Do (KR)

(73) Assignee: Fairchild Semiconductor Corporation, South Portland, ME (US)

( * ) Notice: Subject to any disclaimer, the term of this patent is extended or adjusted under 35 U.S.C. 154(b) by 119 days.

(21) Appl. No.: 11/375,683

(22) Filed: Mar. 13, 2006

(65) Prior Publication Data

US 2007/0210341 A1    Sep. 13, 2007

(51) Int. Cl.
*H01L 29/93* (2006.01)

(52) U.S. Cl. .............................. 257/495; 257/E29.005; 257/E29.024; 438/140

(58) Field of Classification Search ................. 257/288, 257/328, 331, 487, 488, 489, 490, 491, 492, 257/493, 494, 495, E29.005, E29.024, E29.026, 257/E29.027; 438/140
See application file for complete search history.

(56) References Cited

U.S. PATENT DOCUMENTS

| | | | | |
|---|---|---|---|---|
| 5,028,548 A * | 7/1991 | Nguyen | ........................ | 438/488 |
| 5,216,275 A * | 6/1993 | Chen | .......................... | 257/493 |
| 5,545,915 A * | 8/1996 | Disney et al. | ................ | 257/491 |
| 6,677,626 B1 | 1/2004 | Shindou et al. | | |
| 6,683,363 B2 | 1/2004 | Challa | | |
| 6,696,728 B2 * | 2/2004 | Onishi et al. | ................. | 257/341 |
| 6,724,042 B2 | 4/2004 | Onishi et al. | | |
| 7,170,119 B2 * | 1/2007 | Yamauchi et al. | ........... | 257/288 |
| 7,345,342 B2 * | 3/2008 | Challa et al. | ................. | 257/341 |
| 2003/0222327 A1 * | 12/2003 | Yamaguchi et al. | ......... | 257/500 |
| 2004/0026735 A1 * | 2/2004 | Suzuki et al. | ............... | 257/329 |
| 2005/0167742 A1 * | 8/2005 | Challa et al. | ................. | 257/328 |
| 2005/0224848 A1 * | 10/2005 | Kurosaki et al. | ............ | 257/288 |
| 2007/0001230 A1 | 1/2007 | Lee et al. | | |
| 2007/0029597 A1 | 2/2007 | Lee et al. | | |

OTHER PUBLICATIONS

Sze, S. M., *Physics of Semiconductor Devices*, 2nd edition, pp. 63-108, published by John Wiley & Sons (1981).
Notification Concerning Transmittal of International Preliminary Report on Patentability, dated Sep. 25, 2008, with Written Opinion of the International Searching Authority, dated Oct. 1, 2007, in corresponding Appln. No. PCT/US2007/062817, 6pp.

* cited by examiner

*Primary Examiner*—W. David Coleman
*Assistant Examiner*—Su C Kim
(74) *Attorney, Agent, or Firm*—Townsend and Townsend and Crew LLP

(57) ABSTRACT

A charge balance semiconductor power device comprises an active area having strips of p pillars and strips of n pillars arranged in an alternating manner, the strips of p and n pillars extending along a length of the active area. A non-active perimeter region surrounds the active area, and includes at least one p ring surrounding the active area. One end of at last one of the strips of p pillars extending immediately adjacent an edge of the active area terminates at a substantially straight line at which one end of each of the remainder of the strips of p pillars also end. The straight line extends perpendicular to the length of the active area along which the strips of n and p pillars extend.

14 Claims, 7 Drawing Sheets

PERIPHERY DESIGN FOR CHARGE BALANCE POWER DEVICES

CROSS-REFERENCES TO RELATED APPLICATIONS

This application is related to the commonly assigned U.S. application Ser. No. 11/026,276, filed Dec. 29, 2004 which disclosure is incorporated herein by reference in its entirety for all purposes.

BACKGROUND OF THE INVENTION

The present invention relates to semiconductor power device technology, and more particularly to periphery design for charge balance power devices.

A vertical semiconductor power device has a structure in which electrodes are arranged on two opposite planes. When the vertical power device is turned on, a drift current flows vertically in the device. When the vertical power device is turned off, due to a reverse bias voltage applied to the device, depletion regions extending in the horizontal direction are formed in the device. To obtain a high breakdown voltage, a drift layer disposed between the electrodes is formed of a material having high resistivity, and a thickness of the drift layer is increased. This, however, leads to an increase in the device on-resistance Rdson, which in turn reduces conductivity and the device switching speed, thereby degrading the performance of the device.

To address this issue, charge balance power devices with a drift layer comprising vertically extending n regions (n pillar) and p regions (p pillar) arranged in an alternating manner have been proposed. FIG. 1A is a layout diagram of such a device 100. Device 100 includes an active area 110 surrounded by a non-active perimeter region which includes a p ring 120 and an outer termination region 130. The perimeter p ring 120 has a rectangular shape with rounded corners. Termination region 130 may include similarly shaped alternating p and n rings, depending on the design. Active area 110 includes alternately arranged p pillars 110P and n pillars 110N extending vertically in the form of strips and terminating along the top and bottom at the perimeter ring 120. The physical structure of the alternating p and n pillars in the active area can be seen more clearly in FIG. 1B which shows a cross section view in array region 110 along line A-A' in FIG. 1A.

The power device depicted in FIG. 1B is a conventional planar gate vertical MOSFET with a drift layer 16 comprising alternating p pillars 110P and n pillars 110N. Source metal 28 electrically contacts source regions 20 and well regions 18 along the top-side, and drain metal 14 electrically contacts drain region 12 along the bottom-side of the device. When the device is turned on, a current path is formed through the alternating conductivity type drift layer 16. The doping concentration and physical dimensions of the n and p pillars are designed to obtain charge balance between adjacent pillars thereby ensuring that drift layer 16 is fully depleted when the device is in the off state.

Returning to FIG. 1A, to achieve a high breakdown voltage, the quantity of n charges in the n pillars and the quantity of p charges in p pillars must be balanced in both the active area 110 and at the interface between the active area and the non-active perimeter region. However, achieving charge balance at all interface regions, particularly along the top and bottom interface regions where the p and n pillars terminate into perimeter ring 120, as well as in the corner regions where the n and p pillars have varying lengths, is difficult because of the change in geometry of the various regions. This is more clearly illustrated in FIG. 1C which shows an enlarged view of the upper left corner of power device 100 in FIG. 1A.

In FIG. 1C, a unit cell in active area 110 is marked as S1. Active p pillar 111 (which is divided into a left half portion 111-1 and a right half portion 111-2) and active p pillar 113 (which is divided into left half portion 113-1 and right half portion 113-2) are separated by an n pillar 112. The sum (Qp1+Qp2) of the quantity of p charges Qp1 in the right half portion 111-2 of the active p pillar 111 and the quantity of p charges Qp2 in the left half portion 113-1 of the active p pillar 113 in unit cell S1 is equal to the quantity of n charges Qn1 in the active n pillar 112. An optimum breakdown voltage is thus achieved in all parts of active area 110 where such balance of charge is maintained.

As shown, the corner portion of the non-active perimeter region includes the perimeter p ring 120 and termination region 130 with n ring 131 and p ring 132 which are arranged in an alternating manner. Perimeter p ring 120 (which is divided into a lower half portion 121 and an upper half portion 122) and termination region p ring 132 (which is divided into lower half portion 132-1 and upper half portion 132-2) are separated by n ring 131. The sum (Qpt1+Qpe) of the quantity of p charges Qpt1 in the lower half portion 132-1 of p ring 132 and the quantity of p charges Qpe in the upper half portion 122 of ring 120 in unit cell S2 is equal to the quantity of n charges Qnt in n ring 131. An optimum breakdown voltage is thus achieved in all parts of the non-active perimeter region where such balance of charge is maintained.

However, because of geometrical limitations, particularly in the corner region C where the length of the active n and p pillars gradually reduces, the quantity of p charges and the quantity of n charges at the interface between region C and the non-active perimeter region are unbalanced such that surplus p charges exist. The absence of charge balance in these corner regions results in a deterioration of the breakdown characteristics of the device. Thus, there is a need for charge balance techniques which eliminate the prior art charge imbalance problems, thereby leading to higher breakdown voltage ratings.

BRIEF SUMMARY OF THE INVENTION

In accordance with an embodiment of the invention, a charge balance semiconductor power device includes an active area comprising strips of first conductivity type pillars and strips of second conductivity type pillars arranged in an alternating manner. The strips of first conductivity type pillars and strips of second conductivity type pillars extend along a length of the active area. A non-active perimeter region surrounds the active area, and includes at least one ring of the first conductivity type surrounding the active area. One end of at last one of the strips of first conductivity type pillars extending immediately adjacent an edge of the active area terminates at a substantially straight line at which one end of each of the remainder of the strips of first conductivity type pillars also end. The straight line extends perpendicular to the length of the active area along which the strips of first and second conductivity type pillars extend.

In one embodiment, every two adjacent strips of first conductivity type pillars are spaced from one another by a first spacing. The straight line defines a first edge of the active area such that the first edge of the active area is spaced from the at least one ring of the first conductivity type by a second spacing.

In another embodiment, the second spacing is smaller than the first spacing.

In another embodiment, the second spacing is equal to about one-half of the first spacing.

In yet another embodiment, the strips of first conductivity type pillars and the strips of second conductivity type pillars abut at one end the at least one ring of the first conductivity type.

In accordance with another embodiment of the invention, a charge balance semiconductor power device includes an active area comprising vertically-extending strips of first conductivity type pillars and vertically-extending strips of second conductivity type pillars arranged in an alternating manner. Every two adjacent strips of first conductivity type pillars are spaced from one another by a first spacing. A non-active perimeter region surrounds the active area, and includes at least two horizontally-extending strips of first conductivity type pillars and at least two vertically-extending strips of first conductivity type pillars. The at least two horizontally-extending strips of first conductivity type pillars are spaced from one another by a second spacing, and the at least two vertically-extending strips of first conductivity type pillars in the non-active perimeter region are spaced from one another by a spacing substantially equal to the second spacing. An end of each of the at least two horizontally-extending strips of first conductivity type pillars is spaced from a corresponding one of the at least two vertically-extending strips of first conductivity type pillars in the non-active perimeter region by a third spacing, wherein the second spacing is greater than the third spacing.

In one embodiment the second spacing is substantially equal to the first spacing.

In another embodiment, an end of the vertically-extending strips of first conductivity type pillars in the active area is spaced from one of the at least two horizontally-extending strips of first conductivity type pillars by a spacing substantially equal to the third spacing.

In another embodiment, each of the at least two vertically-extending strips of first conductivity type pillars in the non-active perimeter region extends past an end of a corresponding one of the at least two horizontally-extending strips of first conductivity type pillars by a predetermined distance.

In yet another embodiment, the third spacing is substantially equal to one-half the second spacing.

A further understanding of the nature and the advantages of the invention disclosed herein may be realized by reference to the remaining portions of the specification and the attached drawings.

DETAILED DESCRIPTION OF THE INVENTION

Figure 2B:
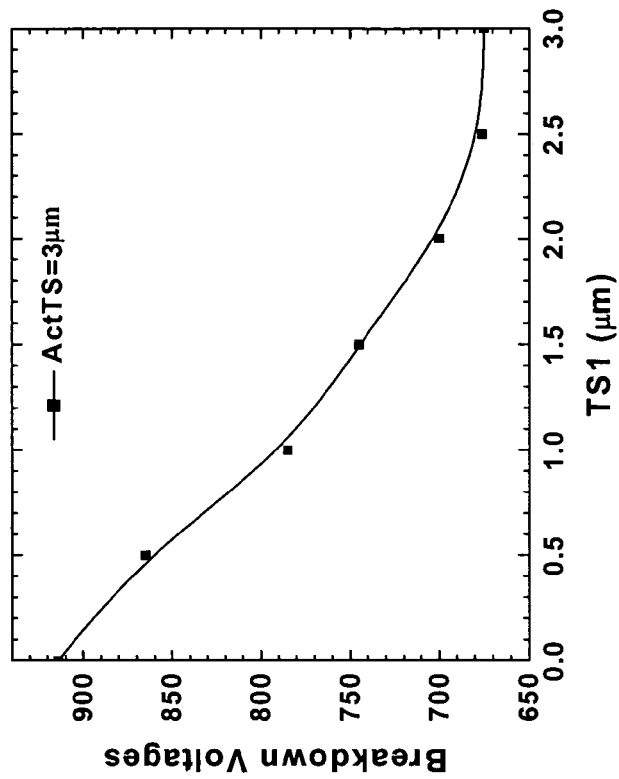
FIG. 2B shows simulated breakdown voltage values for various exemplary dimensions in FIG. 2A.
Figure 2A:
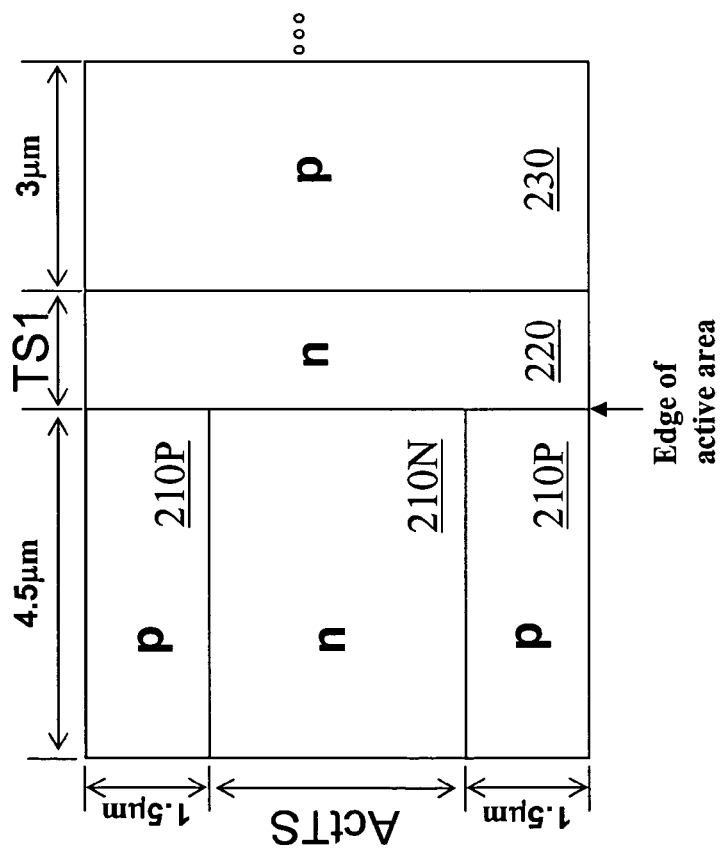
FIG. 2A shows a simplified layout diagram at an interface region between an active area of the die and a non-active perimeter region of the die, in accordance with an exemplary embodiment of the invention.

FIG. 2A shows a simplified layout diagram at an interface region between an active area of the die and a non-active perimeter region of the die which houses a charge balance power device, in accordance with an exemplary embodiment of the invention. Alternating p pillars 210P and n pillars 210N extend in the active area of the device. Active pillars 210N, 210P terminate at a non-active perimeter n strip 220. A first non-active perimeter p strip 230 extends on the outside of the perimeter n strip 220. In the exemplary charge balance device shown in FIG. 2A, active p pillars 210P and non-active perimeter p strip 230 are formed by creating trenches in the silicon and filling them with p-type silicon using such techniques as selective epitaxial growth (SEG). Accordingly, the spacing between adjacent active p pillars 220P is marked as active trench spacing ActTS, and the spacing between the edge of the active area and the first perimeter p strip 230 is marked as first trench spacing TS1.

The term "active area" is used herein to identify region of the device in which active cells capable of conducting current are formed, and the term "non-active perimeter region" is used to identify region of the device in which non-conducting structures are formed.

FIG. 2B shows simulated breakdown voltage values for various exemplary dimensions in FIG. 2A. The breakdown voltage versus first trench spacing TS1 is plotted for active trench spacing ActTS of 3 µm. As can be seen, higher breakdown voltages are obtained when TS1 is smaller than ActTS (i.e., TS1<ActTS), and when the active pillars 210N, 210P abut the first perimeter p strip 230 (i.e., TS1=0), the highest breakdown voltage is obtained.

Figure 3:
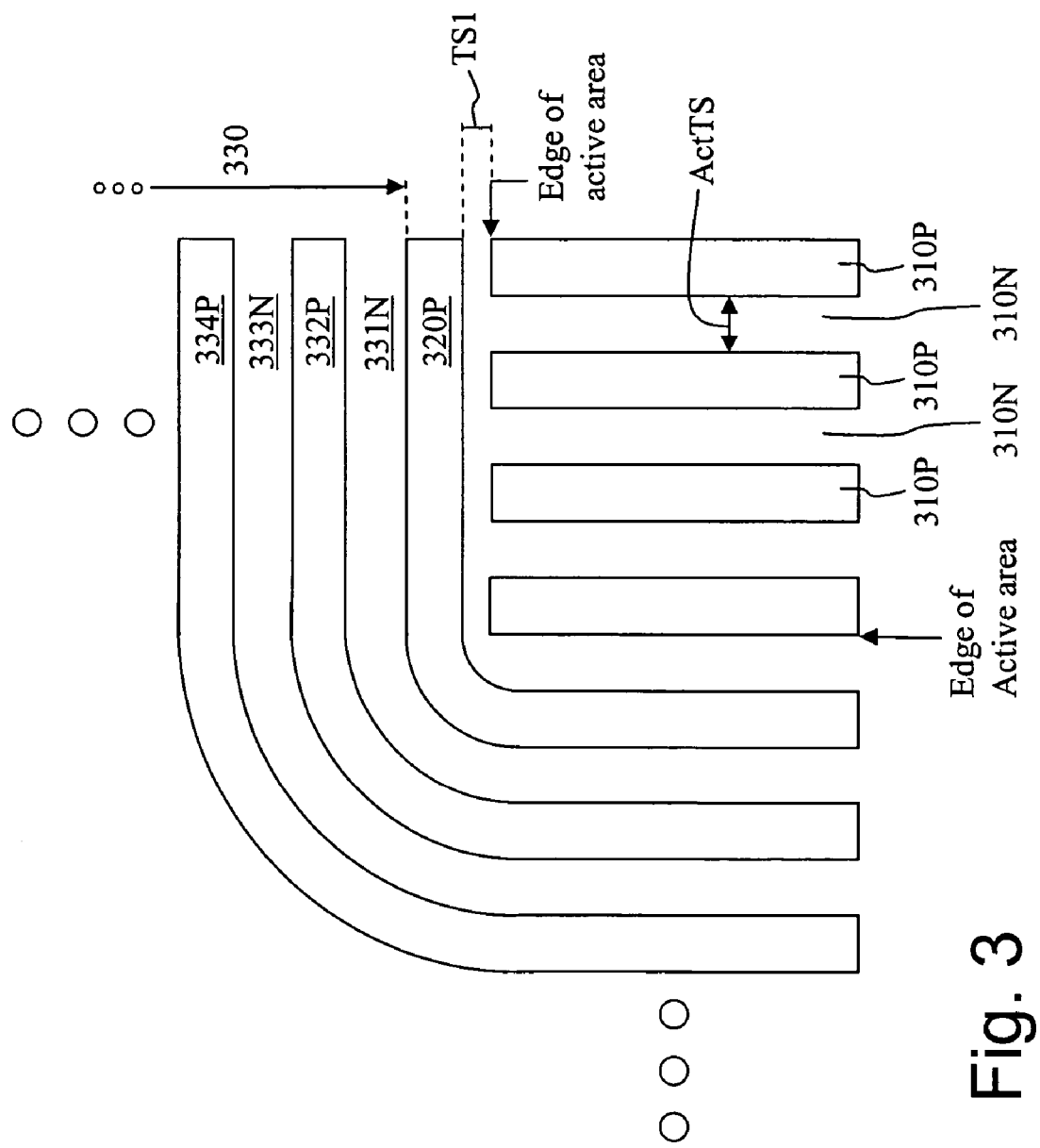
FIG. 3 is a simplified layout diagram showing a corner design for charge balance power devices in accordance with an exemplary embodiment of the invention.

FIGS. 3-6 are simplified layout diagrams of various corner designs for charge balance power devices in accordance with exemplary embodiments of the invention. In FIG. 3, the vertical and horizontal outer boundaries of the active area are marked. The active area comprises p pillars 310P and n pillars 310N arranged in an alternating manner as shown. A first p ring 320P in the non-active outer perimeter of the device is spaced from the horizontal edge of the active area a first trench spacing TS1. Termination region 330 comprises p rings 332P, 334P and n rings 331N, 333N arranged in an alternating manner. An active trench spacing between adjacent p pillars 310P in the active area is marked as ActTS. The spacing between adjacent p rings in the non-active perimeter region is also equal to ActTS, although the invention is not limited as such (i.e., a different trench spacing may be used in the non-active perimeter region than in the active area).

The corner design in FIG. 3 advantageously incorporates the design criterion for obtaining high breakdown voltage derived from FIGS. 2A, 2B, namely, the relationship between spacings TS1 and ActTS in FIG. 3 is TS1<ActTS. Another important feature of the FIG. 3 design is that unlike the last few p pillars 110P and n pillars 110N along the left edge of active area 110 in prior art FIG. 1C which terminate at different heights and thus have different lengths than the rest of the pillars in the active area, all n pillars 310N and p pillars 310P in the active area in the FIG. 3 embodiment terminate at substantially the same height corresponding to the horizontal dimension marked in FIG. 3 as the "edge of active area," and thus have substantially the same length. This not only provides an improved charge balance at the corners of the active area, but also results in the active area extending over a larger portion of the available silicon area thus achieving a more efficient use of the silicon.

Figure 4:
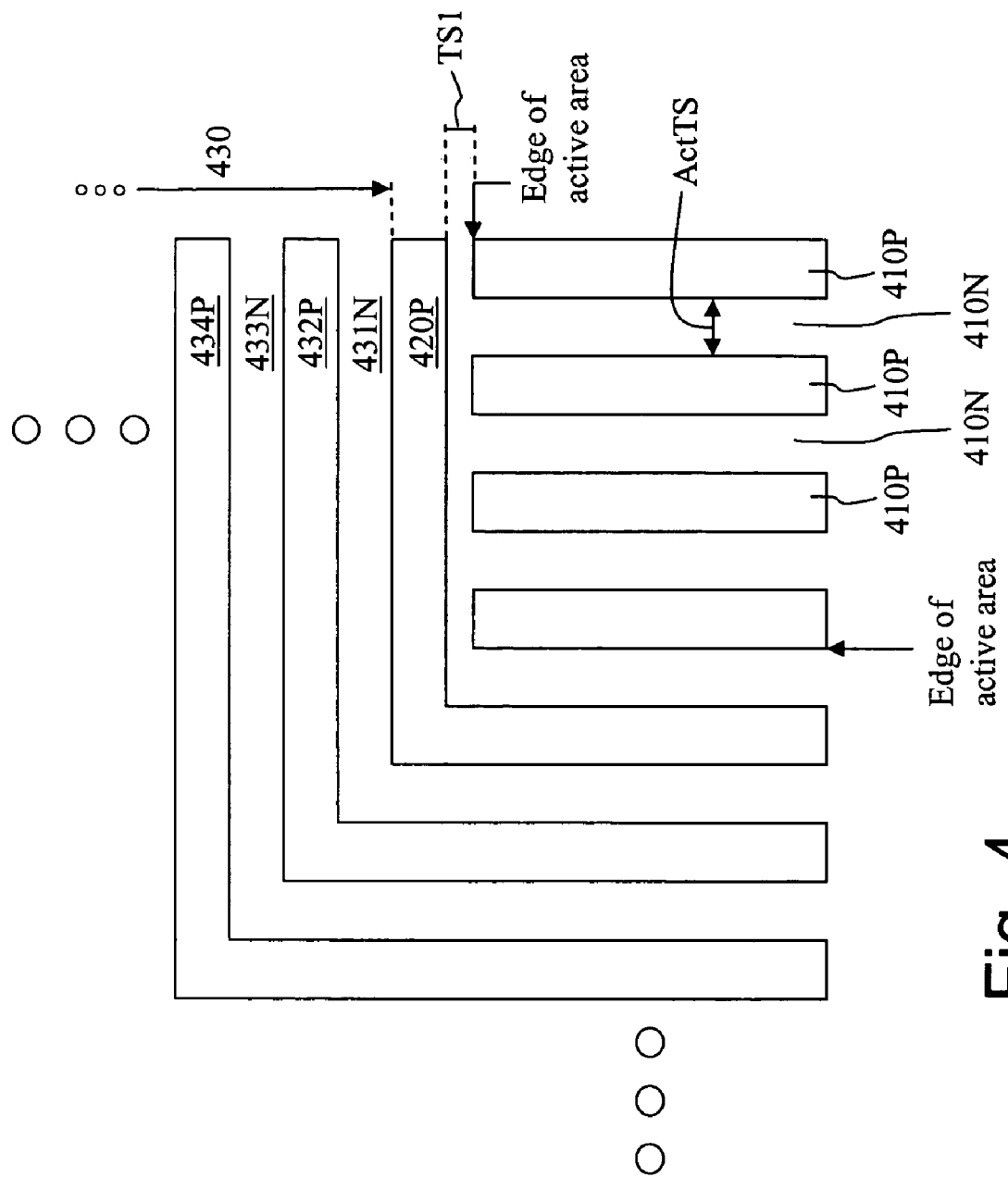
FIG. 4 is a simplified layout diagram showing a corner design for charge balance power devices in accordance with another exemplary embodiment of the invention.

The embodiment in FIG. 4 is similar to that in FIG. 3 except that the non-active perimeter rings 420P, 431N, 432P, 433N, 434P turn at a sharper angle at the corner of the die than those in FIG. 3. While the rings are shown as having a sharp 90° angle, in practice these rings will be slightly rounded at the corners. As in the FIG. 3 embodiment, all p pillars 410P and n pillars 410N in the active area have substantially the same length, and TS1 is smaller than ActTS. In one embodiment, TS1 equals about one half ActTS.

Figure 5:
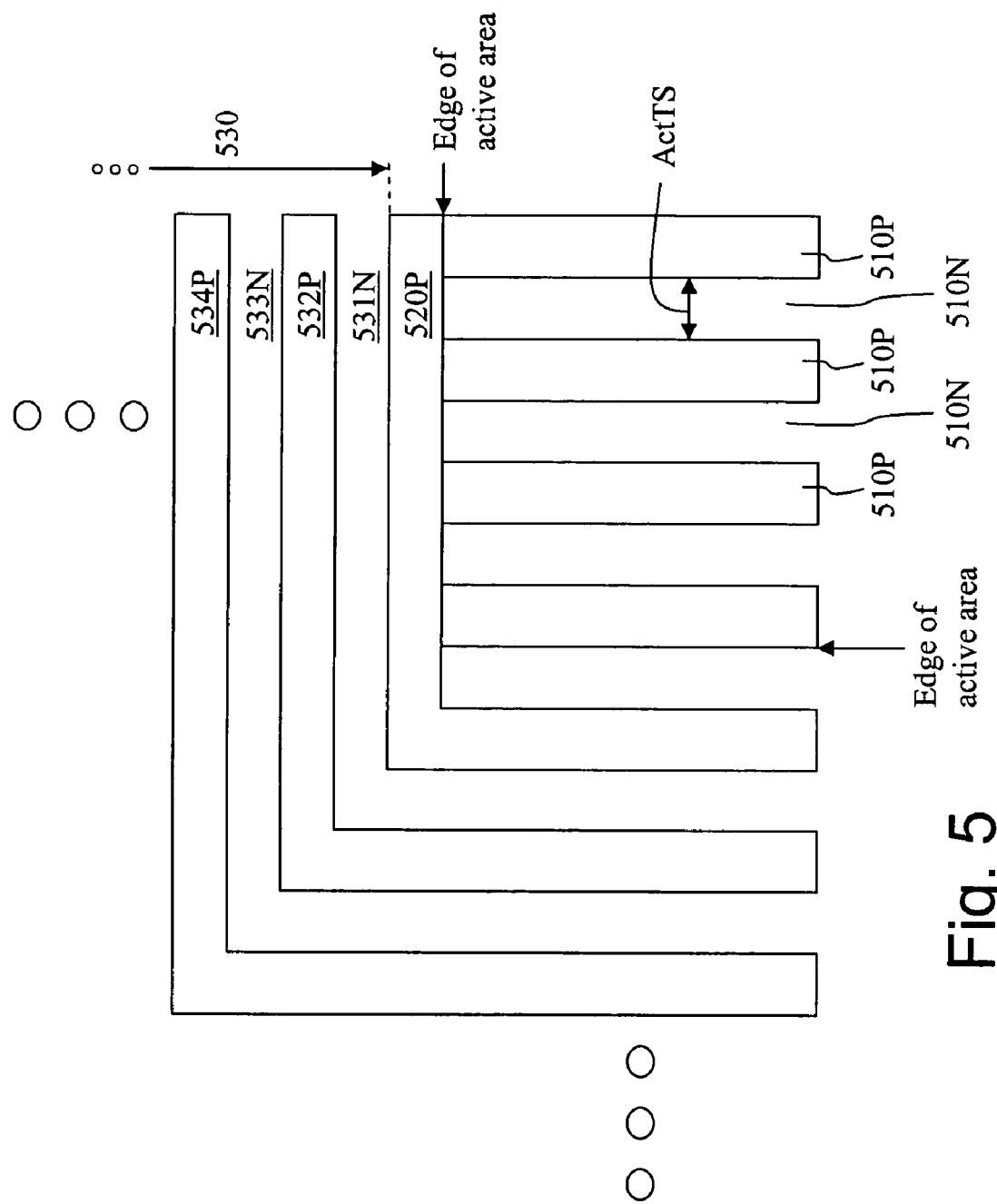
FIG. 5 is a simplified layout diagram showing a corner design for charge balance power devices in accordance with yet another exemplary embodiment of the invention.

The FIG. 5 embodiment is similar to that in FIG. 4 except that TS1 is set to zero, and thus active pillars 510N, 510P terminate at and abut the first non-active perimeter p ring 520P. Once again, with all active pillars having the same length, an improved charge balance structure is obtained at the corner of the die, and silicon utility is maximized.

Figure 6:
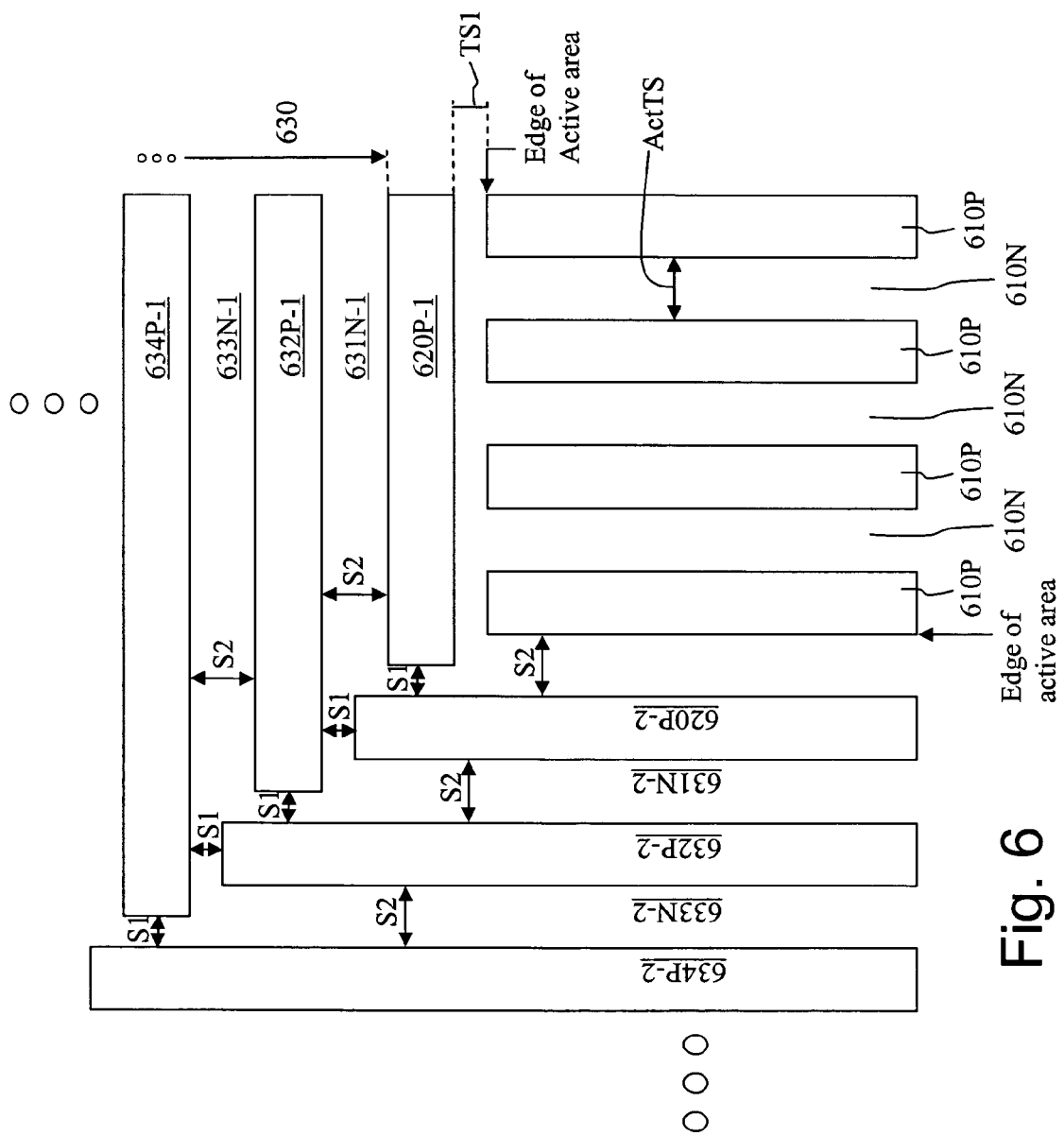
FIG. 6 is a simplified layout diagram showing a corner design for charge balance power devices in accordance with yet another exemplary embodiment of the invention.

FIG. 6 shows an embodiment similar to that in FIG. 4 except the perimeter rings are made discontinuous and offset from one another in a particular manner so as to obtain optimum charge balance both at the interface between the active area and the non-active outer perimeter and in the corner region. In FIG. 6, spacing TS1 is generally smaller than spacing ActTS as in previous embodiments, and in one embodiment spacing TS1 is about one half of spacing ActTS. Making the perimeter p rings discontinuous at the corners enables offsetting the discontinuous lateral and horizontal segments of the perimeter rings. As shown, horizontal p segment 620P-1 and vertical p segment 620P-2 (which in previous embodiments formed a continuous ring) are spaced from one another by a spacing S1. Additionally, the vertical p segment 620P-2 is extended past the horizontal p segment 620P-1, and is spaced from the next horizontal p segment 632P-1 a distance equal to S1. The other perimeter vertical and horizontal p segments are similarly arranged.

The horizontal perimeter p segments 620P-1, 632P-1, 634P-1 are spaced from one another a distance S2, and similarly the vertical perimeter p segments 620P-2, 632P-2, 634P-2 are spaced from another by the distance S2. In general, S1 is smaller than S2. In one embodiment S2 equals ActTS, S1 equals TS1, and S1 equals one half S2 (i.e., S1=TS1=S2/2=ActTS/2). This embodiment achieves optimum charge balance at the corner of the die.

Figure 1B:
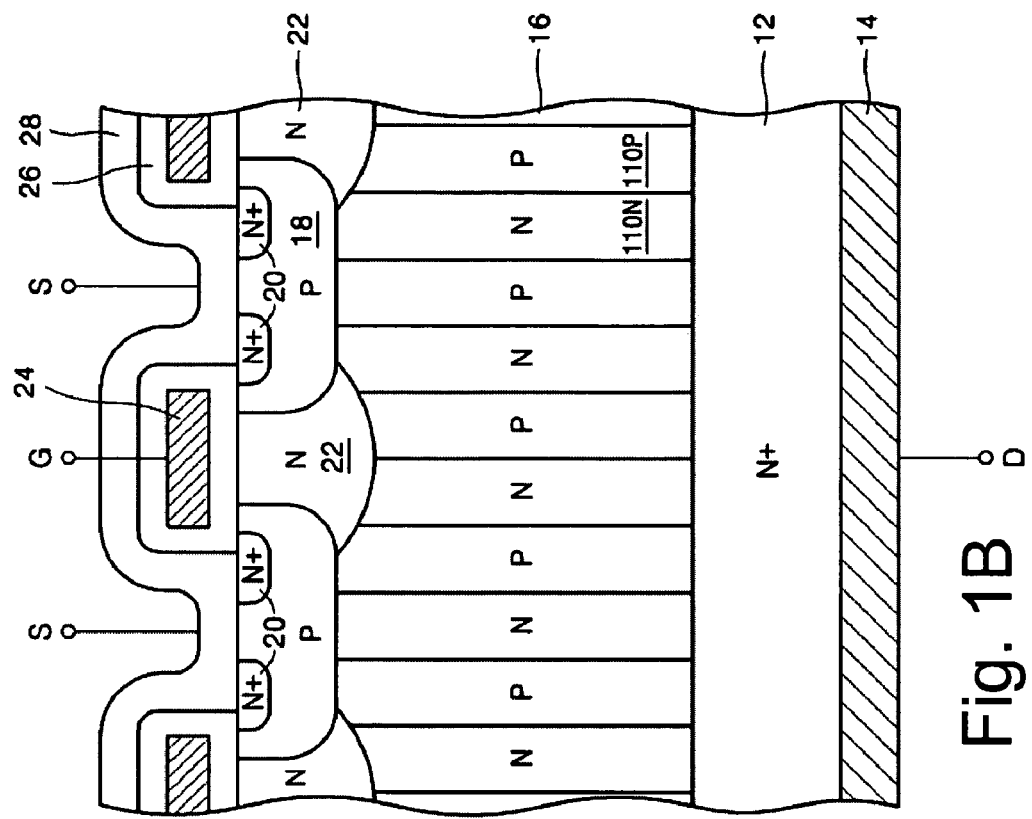
FIG. 1B shows a cross section view along A-A' line in the power device in FIG. 1C.
Figure 1A:
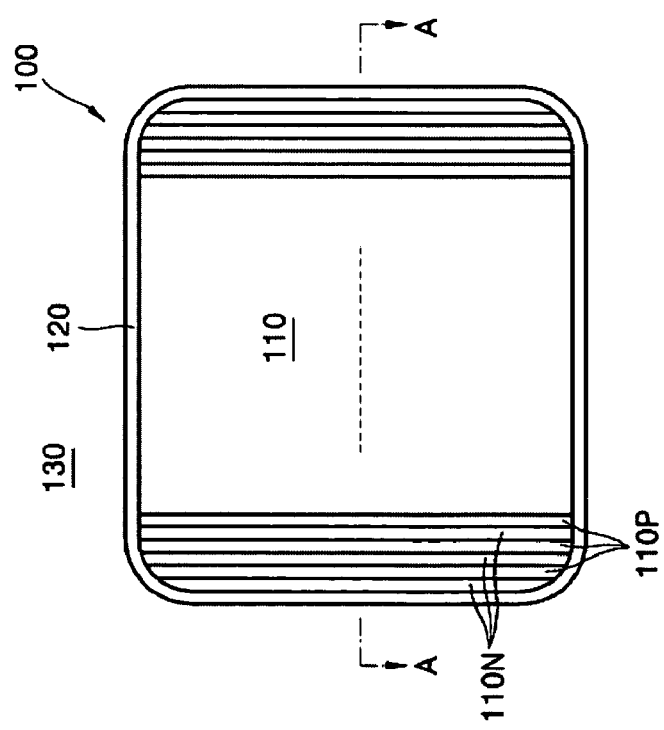
FIG. 1A shows a simplified layout diagram of a conventional charge balance power device.
Figure 1C:
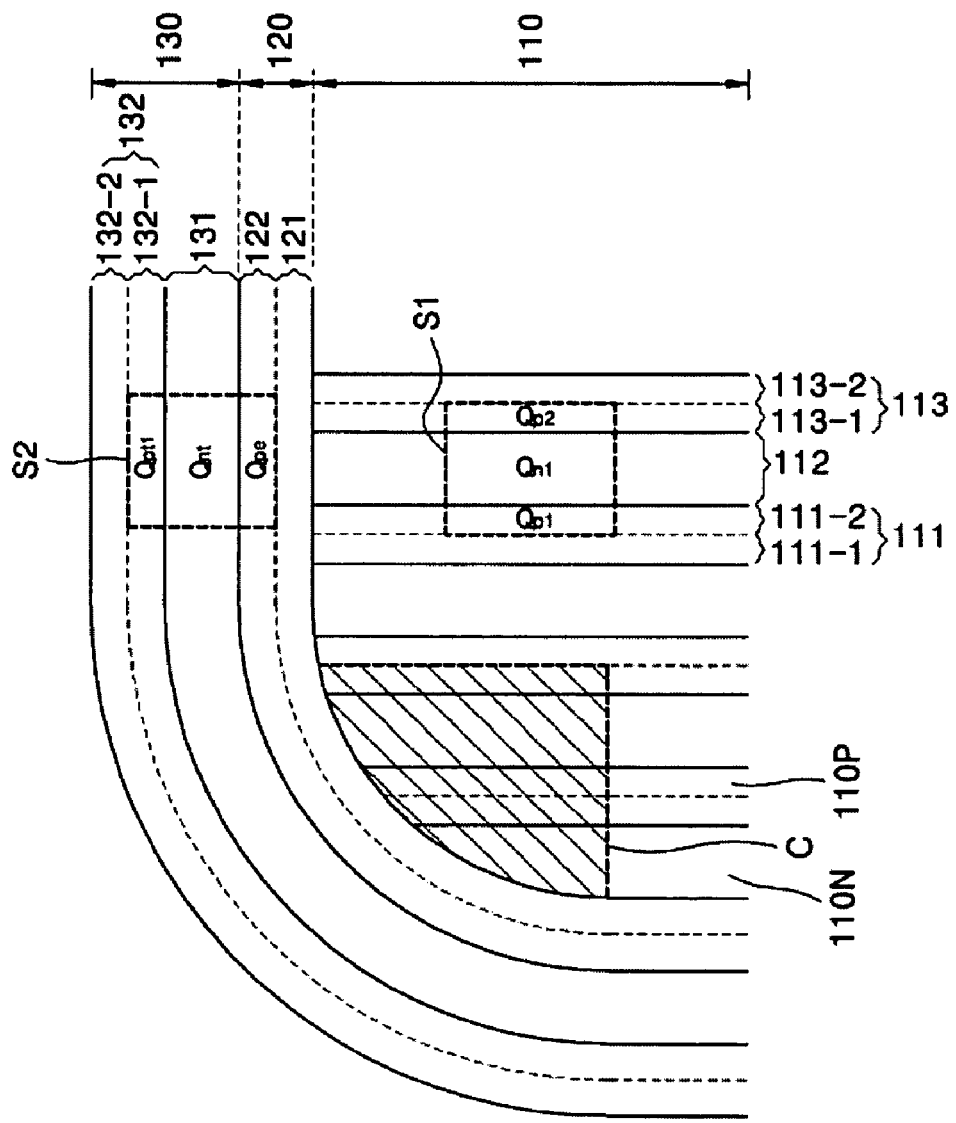
FIG. 1C shows an enlarged view of the upper left corner of the power device in FIG. 1A.

The various charge balance techniques disclosed herein may be integrated with the vertical planar gate MOSFET shown in FIG. 1C, and other charge balance MOSFET varieties such as trench gate or shielded gate structures, as well as other charge balance power devices such as IGBTs, bipolar transistors, diodes and schottky devices. For example, the various embodiments of the present invention may be integrated with any of the devices shown for example, in FIGS. 14, 21-24, 28A-28D, 29A-29C, 61A, 62A, 62B, 63A of the above-referenced U.S. patent application Ser. No. 11/026, 276, filed Dec. 29, 2004 which disclosure is incorporated herein by reference in its entirety for all purposes.

While the above provides a detailed description of various embodiments of the invention, many alternatives, modifications, and equivalents are possible. Also, it is to be understood that all numerical examples and material types provided herein to describe various embodiments are for illustrative purposes only and not intended to be limiting. For example, the polarity of various regions in the above-described embodiments can be reversed to obtain opposite type devices. For this and other reasons, therefore, the above description should not be taken as limiting the scope of the invention as defined by the claims.

What is claimed is:

1. A charge balance semiconductor power device, comprising:
   an active area comprising strips of first conductivity type pillars and strips of second conductivity type pillars arranged in an alternating manner so as to form PN junctions therebetween, the strips of first conductivity type pillars and strips of second conductivity type pillars extending along a length of the active area; and
   a non-active perimeter region surrounding the active area, comprising at least one ring of the first conductivity type surrounding the active area,
   wherein one end of at least one of the strips of first conductivity type pillars extending immediately adjacent an edge of the active area terminates at a straight line at which one end of each of the remainder of the strips of first conductivity type pillars also terminate, the straight line extending perpendicular to the length of the active area along which the strips of first and second conductivity type pillars extend, wherein the end of the at least one of the strips of first conductivity type pillars is structurally identical to the end of each of the remainder of the strips of first conductivity type pillars, and wherein every two adjacent strips of first conductivity type pillars in the active region are spaced from one another by a first spacing, the straight line defining a first edge of the active area, wherein the first edge of the active area is spaced from the at least one ring of the first conductivity type by a second spacing, wherein the second spacing is smaller than the first spacing to thereby increase breakdown voltage in the non-active perimeter region.

2. The charge balance semiconductor power device of claim 1 wherein the second spacing is less than or equal to about one-half of the first spacing.

3. The charge balance semiconductor power device of claim 1 wherein the non-active perimeter region comprises a plurality of rings of the first conductivity type, every two adjacent rings of the first conductivity type being spaced from one another by a distance equal to the first spacing.

4. The charge balance semiconductor power device of claim 1 wherein the at least one ring of the first conductivity type is rectangular or square in shape with rounded corners.

5. The charge balance semiconductor power device of claim 1 wherein the at least one ring of the first conductivity type is rectangular or square in shape with sharp corners.

6. The charge balance semiconductor power device of claim 1 wherein the strips of first conductivity type pillars and the strips of second conductivity type pillars abut at one end the at least one ring of the first conductivity type.

7. The charge balance semiconductor power device of claim 1 wherein the charge balance semiconductor power device is a vertically-conducting power device.

8. The charge balance semiconductor power device of claim 1 wherein the first conductivity type is p type and second conductivity type is n type.

9. A charge balance semiconductor power device, comprising:
   an active area comprising vertically-extending strips of first conductivity type pillars and vertically-extending strips of second conductivity type pillars arranged in an alternating manner, every two adjacent strips of first conductivity type pillars being spaced from one another by a first spacing; and a non-active perimeter region surrounding the active area, comprising at least two horizontally-extending strips of first conductivity type pillars and at least two vertically-extending strips of first conductivity type pillars, the at least two horizontally-extending strips of first conductivity type pillars being spaced from one another by a second spacing, and the at least two vertically-extending strips of first conductivity type pillars in the non-active perimeter region being spaced from one another by a spacing substantially equal to the second spacing, an end of each of the at least two horizontally-extending strips of first conductivity type pillars being spaced from a corresponding one of the at least two vertically-extending strips of first conductivity type pillars in the non-active perimeter region by a third spacing, wherein the second spacing is greater than the third spacing.

10. The charge balance semiconductor power device of claim 9 wherein the second spacing is substantially equal to the first spacing.

11. The charge balance semiconductor power device of claim 9 wherein an end of the vertically-extending strips of first conductivity type pillars in the active area is spaced from one of the at least two horizontally-extending strips of first conductivity type pillars by a spacing substantially equal to the third spacing.

12. The charge balance semiconductor power device of claim 9 wherein each of the at least two vertically-extending strips of first conductivity type pillars in the non-active perimeter region extends past an end of a corresponding one of the at least two horizontally-extending strips of first conductivity type pillars by a predetermined distance.

13. The charge balance semiconductor power device of claim 9 wherein the third spacing is substantially equal to one-half the second spacing.

14. The charge balance semiconductor power device of claim 9 wherein the first conductivity type is p type and second conductivity type is n type.

* * * * *